United States Patent
Beintner et al.

(10) Patent No.: US 7,091,103 B2
(45) Date of Patent: Aug. 15, 2006

(54) TEOS ASSISTED OXIDE CMP PROCESS

(75) Inventors: Jochen Beintner, Wappingers Falls, NY (US); Laertis Economikos, Wappingers Falls, NY (US); Michael Wise, Lagrangeville, NY (US); Andreas Knorr, Austin, TX (US)

(73) Assignees: International Business Machines Corporation, Armonk, NY (US); Infineon Technologies North America Corporation, San Jose, CA (US)

( * ) Notice: Subject to any disclaimer, the term of this patent is extended or adjusted under 35 U.S.C. 154(b) by 686 days.

(21) Appl. No.: 10/314,865

(22) Filed: Dec. 9, 2002

(65) Prior Publication Data

US 2004/0110380 A1 Jun. 10, 2004

(51) Int. Cl.
*H01L 21/76* (2006.01)
*H01L 21/461* (2006.01)
*H01L 21/302* (2006.01)

(52) U.S. Cl. .................. 438/424; 438/427; 438/690; 438/691

(58) Field of Classification Search .................. None
See application file for complete search history.

(56) References Cited

U.S. PATENT DOCUMENTS

| 6,001,696 A | * | 12/1999 | Kim et al. | 438/296 |
| 6,015,755 A | * | 1/2000 | Chen et al. | 438/692 |
| 6,319,796 B1 | * | 11/2001 | Laparra et al. | 438/435 |
| 6,617,251 B1 | * | 9/2003 | Kamath et al. | 438/691 |
| 2003/0013270 A1 | * | 1/2003 | Seitz | 438/424 |

* cited by examiner

*Primary Examiner*—Duy-Vu N Deo
(74) *Attorney, Agent, or Firm*—Todd M. C. Li

(57) ABSTRACT

CMP of integrated circuits containing DRAM arrays with trench capacitors fill the trenches with oxide, resulting in a an array of oxide structures that is dense compared with the concentration in the surrounding support structures and therefore has a higher loading. A conformal layer is deposited over the wafer, increasing the loading in the array, but filling in spaces between active areas. A blanket etch removes material in both the array and the supports. A block etch balances the amount of material in the array and the supports. A supplementary oxide deposition in the array fills spaces between the structures to a nearly uniform density.

16 Claims, 5 Drawing Sheets

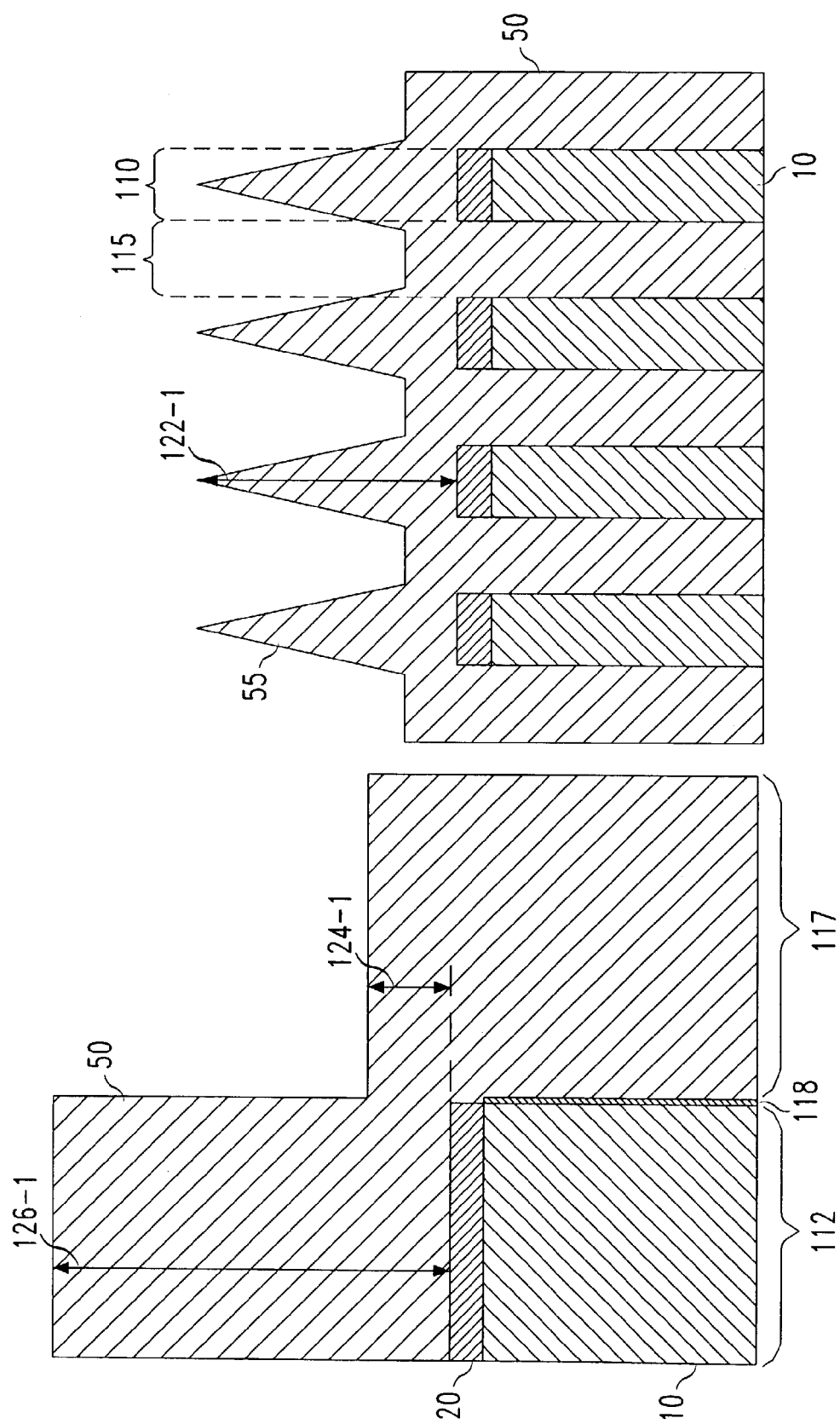

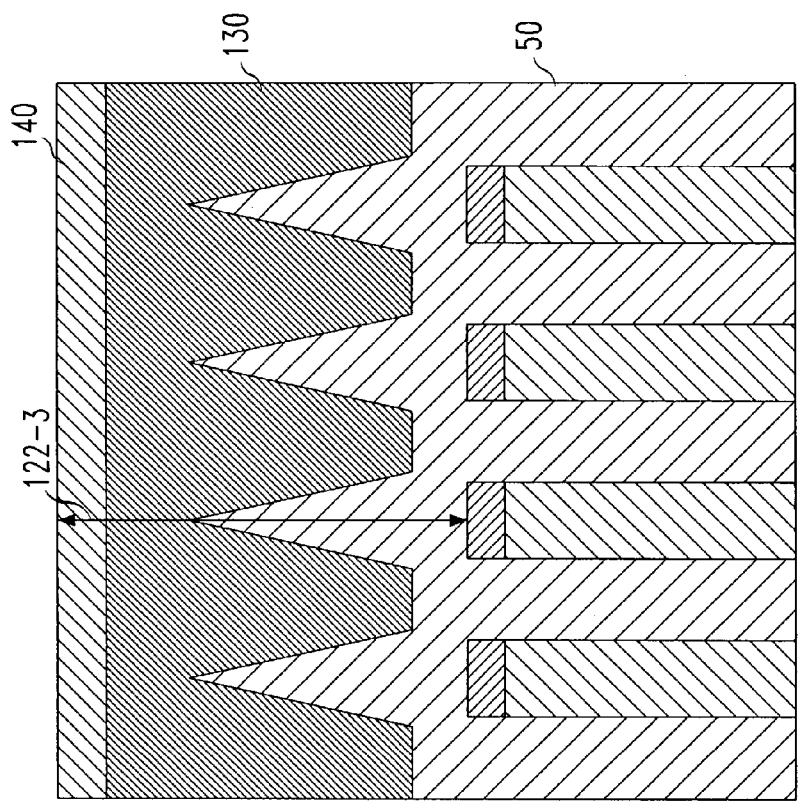
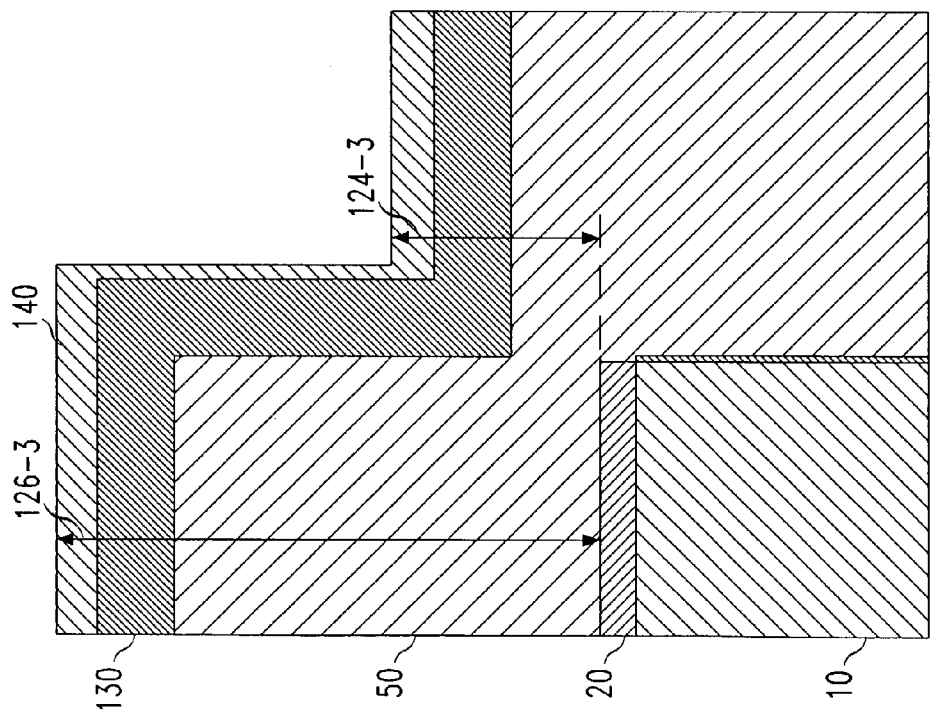
FIG. 3A
FIG. 3B

TEOS ASSISTED OXIDE CMP PROCESS

TECHNICAL FIELD

The field of the invention is that of planarizing an integrated circuit (IC) using chemical-mechanical polishing (CMP), in particular an IC having two areas that differ significantly in structure density.

BACKGROUND OF THE INVENTION

CMP is a popular technique in contemporary integrated circuit processing, for a number of reasons including reduced depth of field in lithography and reduced tolerances in etching. Those skilled in the art are aware of a recurring problem in CMP—that of polishing surfaces that are not uniform.

The polishing rate depends on the loading—the amount of material to be removed per unit area. A solid area will polish more slowly than a sparsely populated area that has projecting areas to be polished on only a small fraction of the total area. The problem is that the sparsely populated areas can be overpolished, resulting to damage to the layer beneath the layer being removed.

An approach that has been used in the art is applying a block etch to the area with the higher loading. This approach often cannot be applied if the topography in the higher loaded area is such that a block etch would damage the structure below the layer being polished.

This problem becomes more acute as layers become thinner and as tolerances become smaller.

SUMMARY OF THE INVENTION

The invention relates to a method of preparing a workpiece for CMP and performing the CMP in which a dense array of smaller features that has a higher loading than other areas has a dummy layer deposited on it that is subsequently etched back.

A feature of the invention is the deposition of a conformal layer on the heavily loaded area that is less in thickness than the height of the structures.

A feature of the invention is the blanket deposition of a planarizing layer on both heavily and lightly loaded areas.

Another feature of the invention is a block etch of the more densely populated, thinner area to reduce it in thickness.

BRIEF DESCRIPTION OF THE DRAWINGS

FIGS. 1–5 show in cross section a portion of a DRAM array and of support circuitry at various steps of the inventive process.

DETAILED DESCRIPTION

Figures 2A, 2B:
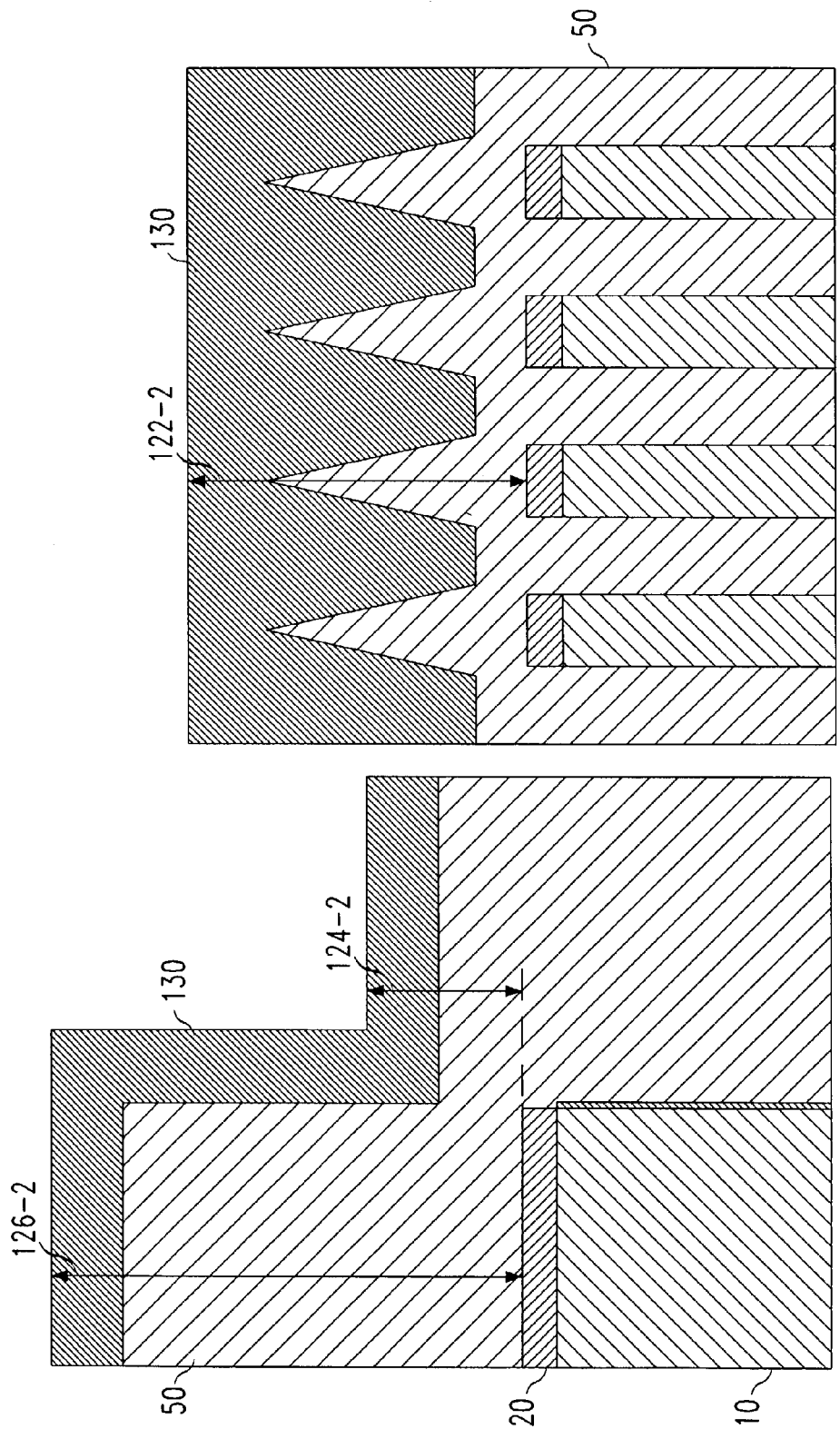

FIG. 1 shows two portions of an integrated circuit formed in substrate 10 with pad oxide and pad nitride 20 formed in preparatory steps—a DRAM array on the right and a portion of the logic devices in the support area on the left. The DRAM array is dense (meaning a greater number of features per unit of area than the average on the chip)—having active areas with a width denoted by bracket 110 and trenches for capacitors denoted with bracket 115.

The support area has isolation trenches denoted by bracket 117 (and having a thermal oxide liner 118) and a typical active area width denoted by bracket 112. Both dimensions 112 and 117 are wider than their counterparts 110 and 115. Both isolation trenches in the array and the support have the same depth as they are etched at the same time, and are filled with HDP (high density plasma) oxide 50. The equality of depth is not a necessity, as they could be also etched separately with the cost of another block mask. In the array, the amount of oxide forming on the tops of the active areas is a nominal 500 nm (distance 122-1) above the top of nitride 20. In the supports, the active areas are wider and further apart and the oxide therefore forms a higher residual layer of 950 nm (distance 126-1), with 175 nm formed on the isolation trenches 117 (distance 124-1). The shape of the "hat" on an array active area and its reduced height compared with the corresponding height in the support area is the result of the narrower active area in the array compared to the support.

The problem addressed by the present invention is that, although the peaks above the DRAM active areas are shorter than those over the logic active areas, the loading is high enough that there is residual oxide in the array when the polishing process in the support area reaches the pad nitride. Further polishing would result in an overpolish of the support area with the result of oxide dishing in the isolation area and pad nitride removal on the active area. A block etch applied to the array would be unacceptable because it would remove too much material from the low points in the array in the course of lowering the high points.

The solution is to increase the amount of oxide in the array, as shown in FIG. 2. A conventional conformal deposition of TEOS done at low pressure (LPTEOS) oxide 130 (200 nm in the case of the spacing in the example) fills in the narrow spaces in the array and places a conformal coating in the logic area. The thickness of the layer is such that the volume between structures is filled and there is a continuous layer of the new material over the top of the structures. The new dimensions are: thickness 122-2 becomes 700 nm, 124-2 becomes 375 nm and 126-2 becomes 1150 nm. The conformal nature of the TEOS fill tends to planarize the array by itself, without a CMP (chemical-mechanical polishing) step at this time. As can be seen on the left of the figure, the shape of the structures in the support area is not substantially changed by this deposit. Thus, this deposit has changed the relative planarity of the areas. The array is considerably more planar and the support is unchanged. The array should be more or less covered by a continuous oxide film in order to avoid etching too deeply during the etch back.

Referring now to FIG. 3, there is shown the result of an optional second deposition—this time of HDP oxide. This HDP deposition has been performed to adjust for non-uniformities of the first HDP oxide deposition and the LPTEOS deposition; it is not necessary if the uniformity of the HDP and LPCVD oxide is good enough. This layer is not always required and is performed to balance the amount of oxide between the array and the supports. The dimensions become: thickness 122-3 becomes 800 nm, 124-3 becomes 475 nm and 126-3 becomes 1250 nm.

Figure 4A:
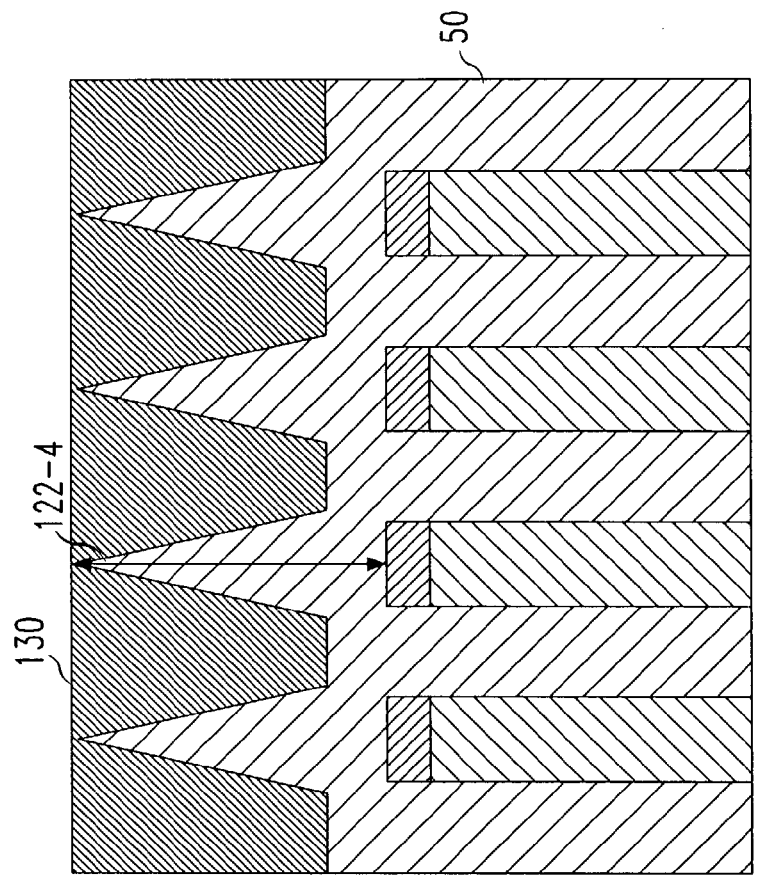
Figure 4B:
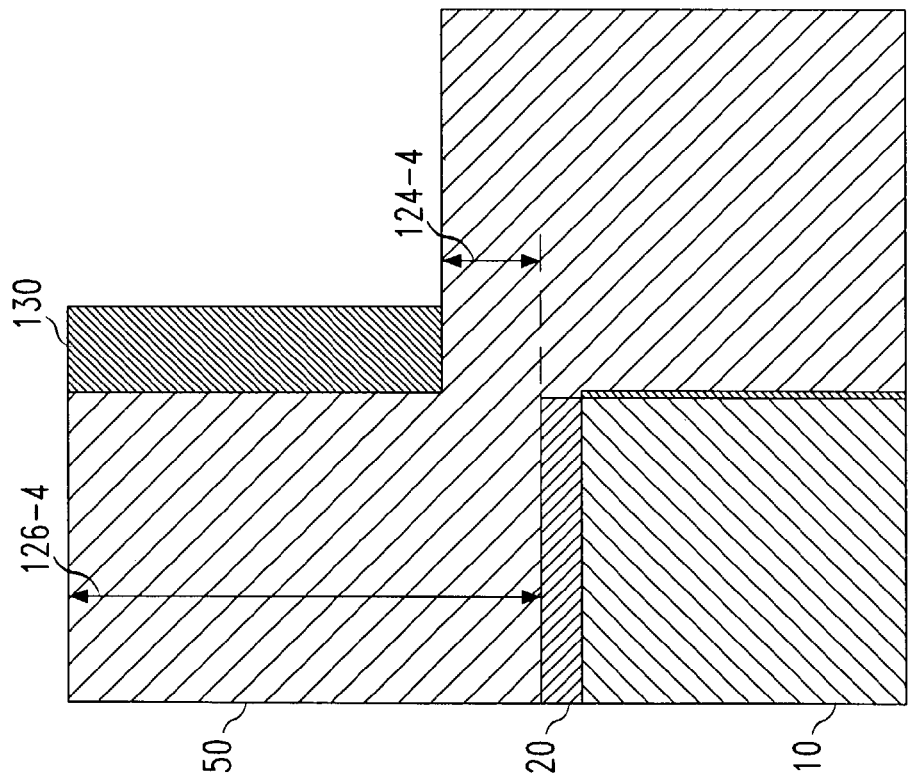

Next, having increased the thickness across the wafer, the wafer receives a blanket etch to remove 400 nm across the wafer. As seen in FIG. 4, the array oxide thickness 122-4 goes back to the initial height of 500 nm (now in a uniform thickness composite layer of HDP and TEOS), while 124-4 becomes 175 nm and 126-4 becomes 950 nm. The result of these steps is that a) the overall oxide loading has been reduced, therefore reducing the amount of oxide to be removed by CMP; and b) the oxide loading ratio between array and support necessary to achieve a uniform CMP process has been provided (after the second etch that follows). It does not matter if the thickness is above or below the former HDP peaks.

Figure 5B:
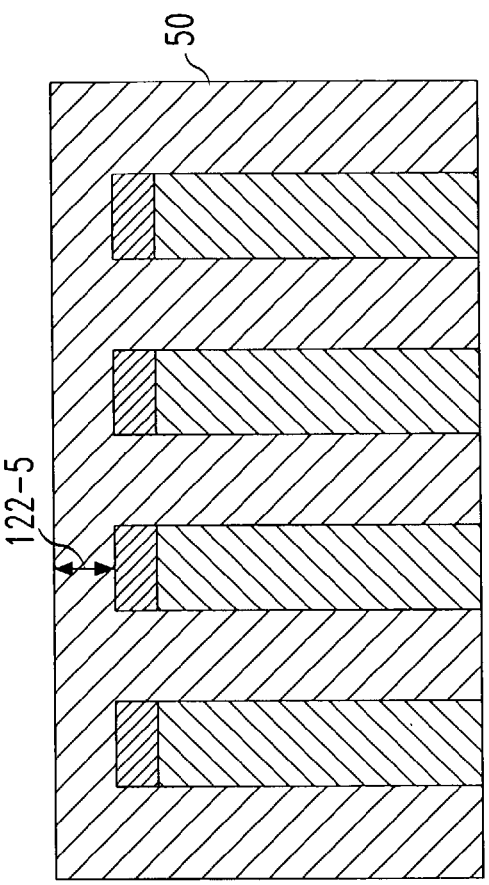
Figure 5A:
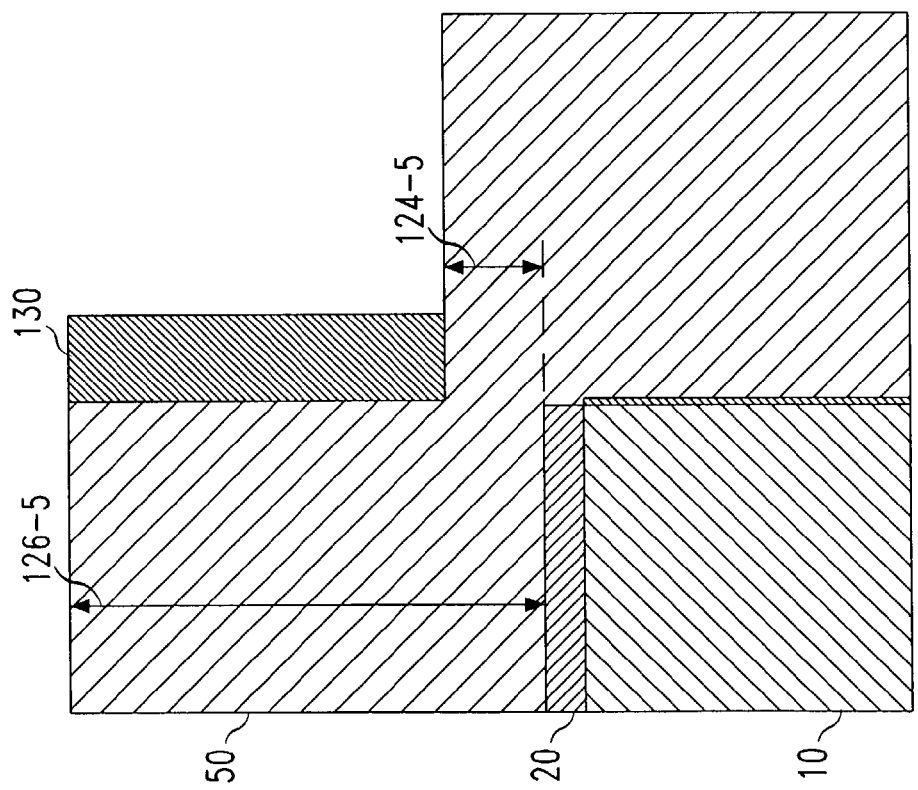

As a final preparatory step before the CMP, a second etch is performed, with the same chemistry as the previous blanket etch. This is a block etch. A block mask exposes only the array, which receives a 400 nm etch. The dimensions before the CMP step are now: thickness 122-5 becomes 100 nm, 124-5 remains 175 nm and 126-5 remains 950 nm, as illustrated in FIG. 5.

The result of this process, as has been verified experimentally, is that both the array and the supports polish down to the pad nitride, without residuals or overpolishing.

Those skilled in the art will appreciate that fine-tuning of the thicknesses deposited and etched may be required to allow for variations in the density of the support devices and the dimensions of the active areas. With a given array dimension, the loading outside the array will vary depending on the chip being fabricated. The parameters given here are for a nominal groundrule of 175 nm and average density in the supports. The overall planarization process is independent of the minimum groundrule, though the numerical values will depend on the relative loading in the array and the supports. That loading, in turn, will depend on the ground rules if the array has the maximum concentration allowed by the ground rules and the supports have a concentration that depends on the particular circuit.

After the wafer has been prepared according to the invention, DRAM cells are formed in the array areas, CMOS transistors are formed outside the array and the various devices are connected to form the integrated circuits. This process is referred to as completing the circuit.

Summarizing, the sequence is:

Prepare a wafer with pad oxide, pad nitride, wells, preliminary implants.

Define the active areas in both the arrays and supports

Isolation trench (IT) etch

IT liner oxidation

IT fill (HDP)

LPCVD TEOS deposition

HDP deposition (optional)

Blanket etch

Block Mask outside array

Array etch back

Oxide CMP

Complete the circuit

The etch is required to etch LPTEOS and HDP with approximately the same etch rate, so that the LPTEOS would have to be densified to a level of HDP if wet etch back is used. In case of RIE etch back no densification is necessary to etch back LPTEOS and HDP 1:1 . The etch chemistry is a conventional fluorine based chemistry.

Those skilled in the art will appreciate that the invention can be practiced with wafers of bulk silicon, SiGe, silicon on insulator, other semiconductors such as GaAs and other materials in addition to oxide. The invention is not confined to DRAM cells or to memory arrays, but can be applied whenever there are two areas having a different density of structures with a different loading. A blanket conformal fill planarizes (at least partially) the higher-density area without significantly affecting the planarity of the lower-density area. The oxide loading in the low density area is increased, but then again decreased with the first RIE etch back.

With both areas substantially planar, a balancing process removes material from the higher-loading area so that the subsequent CMP produces a uniform result.

While the invention has been described in terms of a single preferred embodiment, those skilled in the art will recognize that the invention can be practiced in various versions within the spirit and scope of the following claims.

What is claimed is:

1. A method of planarizing an integrated circuit wafer containing at least two areas of different structure density comprising the steps of:

etching trenches in two areas of said wafer of different density, a first area of higher density and a second area of lower density;

filling trenches in both of said areas with a filler material, whereby said first area has a concentration of structures having a first height above a surface of said wafer and said first density and said second area has a concentration of structures having a second height above said surface of said wafer higher than said first height and a second density lower than said first density;

depositing a blanket conformal film on said wafer, thereby filling and planarizing said first area;

performing a blanket etch on said wafer;

performing a block etch on said first area while said second area is protected; and performing a CMP step on said wafer.

2. A method according to claim 1, in which said first area is an array of memory cells containing trenches and active areas between trenches.

3. A method according to claim 1, in which said blanket conformal film has a conformal film thickness substantially less than said first height.

4. A method according to claim 1, in which said conformal film has a thickness such that the space between said structures in said first area is filled and there is a continuous layer of said conformal film above said structures.

5. A method according to claim 3, in which said conformal film has a thickness such that the space between said structures in said first area is filled and there is a continuous layer of said conformal film above said structures.

6. A method according to claim 1, in which said blanket etch removes said conformal film back to said first height.

7. A method according to claim 5, in which said blanket etch removes said conformal film back to said first height.

8. A method according to claim 1, further comprising a blanket deposition of material after said step of depositing said conformal layer.

9. A method according to claim 5, further comprising a blanket deposition of material after said step of depositing said conformal layer.

10. A method according to claim 7, further comprising a blanket deposition of material after said step of depositing said conformal layer.

11. A method according to claim 1, in which said block etch removes material in said first area to a height below a corresponding thickness in said second area.

12. A method according to claim 5, in which said block etch removes material in said first area to a height below a corresponding thickness in said second area.

13. A method according to claim 2, in which said blanket conformal film has a conformal film thickness substantially less than said first height.

14. A method according to claim 13, in which said conformal film has a thickness such that the space between said structures in said first area is filled and there is a continuous layer of said conformal film above said structures.

15. A method according to claim 14, in which said blanket etch removes said conformal film back to said first height.

16. A method according to claim 15, further comprising a blanket deposition of material after said step of depositing said conformal layer.

* * * * *